(12) United States Patent
Wang et al.

(10) Patent No.: US 8,527,857 B2
(45) Date of Patent: Sep. 3, 2013

(54) PARITY-CHECK-CODE DECODER AND RECEIVING SYSTEM

(75) Inventors: Cheng-Kang Wang, Taichung (TW); Hou-Wei Lin, Hsinchu (TW); Chia-Chun Hung, Taipei County (TW)

(73) Assignee: Realtek Semiconductur Corp., Hsinchu (TW)

( * ) Notice: Subject to any disclaimer, the term of this patent is extended or adjusted under 35 U.S.C. 154(b) by 553 days.

(21) Appl. No.: 12/613,059

(22) Filed: Nov. 5, 2009

(65) Prior Publication Data

US 2010/0122139 A1 May 13, 2010

(30) Foreign Application Priority Data

Nov. 7, 2008 (TW) ................................ 97143143 A

(51) Int. Cl.
*G06F 11/00* (2006.01)
(52) U.S. Cl.
USPC ........................................................ 714/801
(58) Field of Classification Search
USPC ................... 714/800, 801, 802, 804
See application file for complete search history.

(56) References Cited

U.S. PATENT DOCUMENTS

| | | | |
|---|---|---|---|
| 6,487,259 B1 | 11/2002 | Russo | |
| 8,176,383 B2* | 5/2012 | Song et al. | 714/758 |
| 8,316,272 B2* | 11/2012 | Gunnam | 714/752 |
| 2004/0153960 A1* | 8/2004 | Eroz et al. | 714/800 |
| 2006/0136799 A1* | 6/2006 | Choi et al. | 714/752 |
| 2007/0297496 A1* | 12/2007 | Park et al. | 375/148 |
| 2008/0086670 A1 | 4/2008 | Krouk et al. | |
| 2008/0148129 A1* | 6/2008 | Moon et al. | 714/758 |
| 2009/0259915 A1* | 10/2009 | Livshitz et al. | 714/758 |
| 2011/0202816 A1* | 8/2011 | Lin et al. | 714/758 |
| 2012/0054577 A1* | 3/2012 | Kim | 714/755 |

FOREIGN PATENT DOCUMENTS

| | | |
|---|---|---|
| CN | 1852029 A | 10/2006 |
| JP | 2002-244218 A | 8/2002 |
| JP | 2005-099090 A | 4/2005 |
| JP | 2005-103957 A | 4/2005 |

OTHER PUBLICATIONS

Search Report of TW counterpart TW-97143143 dated Feb. 12, 2012 with English Translation.

* cited by examiner

*Primary Examiner* — Marc Duncan
(74) *Attorney, Agent, or Firm* — McClure, Qualey & Rodack, LLP

(57) ABSTRACT

A parity-check-code decoder is adapted for receiving a channel quality ratio and at least (N) bits that are to be decoded. The parity-check-code decoder treats each of the bits as a bit node, and includes: a verifying circuit that multiplies (N) bit nodes by a matrix to obtain (N-K) check nodes; a reliability-generating circuit that generates a reliability index that serves as an extrinsic check index for each of the bit nodes to transmit to the check nodes; a bit exchange circuit that generates an extrinsic bit index for each of the check nodes to transmit to the bit nodes; a check-exchange circuit that updates a plurality of the extrinsic check indices based on the extrinsic bit indices for the bit nodes to transmit to the check nodes; and a reliability-updating circuit that updates the reliability index of and determines an updated value for each of the bit nodes.

17 Claims, 8 Drawing Sheets

US 8,527,857 B2

PARITY-CHECK-CODE DECODER AND RECEIVING SYSTEM

CROSS-REFERENCE TO RELATED APPLICATION

This application claims priority of Taiwanese application no. 097143143, filed on Nov. 7, 2008, the entire contents of which are hereby incorporated by reference.

BACKGROUND OF THE INVENTION

1. Field of the Invention

The invention relates to communication system, more particularly to a error correction code decoder and receiving system.

2. Description of the Related Art

Low-density parity-check (LDPC) code is an error correction code. Since LDPC code allows data transmission rates approaching the Shannon Limit, use of the LDPC code is increasingly incorporated in communications standards such as Digital Video Broadcast-Satellite Version 2 (DVB-S2), Digital Terrestrial Multimedia Broadcasting (DTMB), and IEEE 802.11. At a receiving end, a LDPC code decoder receives (N) bits through a channel. The LDPC code decoder decodes the (N) bits, and treats each of the bits as a bit node. In order to decode correctly the (N) bits, the (N) bit nodes must satisfy (N-K) conditions, wherein the conditions are called "check node".

To reduce channel interference, the LDPC code decoder uses the check node to verify whether the (N) bits have been received correctly. Assuming that the check nodes are zeroes, the LDPC code decoder uses the bit nodes and the check nodes to exchange iteratively probabilities of the bit nodes being '0' or '1', in order to restore the bits that are to be decoded. The above-described process is known as "belief propagation (BP)".

Since iteration calculation is rather complex, the min-sum algorithm is used to approximate. Further, to prevent overestimates of probability, an offset value, namely an offset BP value, is used for correction. However, the offset value cannot change in accordance with changes in channel quality, resulting in inaccurate probabilities of the bit nodes obtained through the iterative process, and poor quality reliability indices associated with decoding output.

Although using an updated channel quality for subsequent iteration calculation was proposed in a 2006 article entitled "LDPC Decoding Algorithm with Estimation of Noise Variance" by Changzheng Ma and Boon Poh Ng, a calculation process described therein is rather complicated, and can burden hardware.

SUMMARY OF THE INVENTION

Therefore, one of the objects of the present invention is to provide a parity-check-code decoder and receiving system capable of reducing computational complexity and increasing decoding reliability.

One of the objects of the present invention provides a parity-check-code decoder and receiving system to increase accuracy of probabilities of bit nodes, and reduce a number of iteration during an iterative process.

According to one aspect of the present invention, there is provided a receiving system adapted to receive through a channel at least N modulated data that are encoded through parity-check (PC) coding, the receiving system comprising: a channel estimator to estimate a channel quality ratio of a channel receiving quality based on the modulated data; and a PC code decoder, coupled to said channel estimator, to obtain at least N bit nodes based on the modulated data, said PC code decoder including a verifying circuit, a reliability-generating circuit, a bit-exchange circuit, a check-exchange circuit, and a reliability-updating circuit.

According to another aspect of the present invention, there is provided a parity-check (PC) code decoder adapted for receiving a channel quality ratio of a channel receiving quality and at least N bits that are encoded in a PC code, each of the at least N bits being as a bit node, said decoder comprising: a verifying circuit to obtain N-K check nodes according to the N bit nodes and a PC code matrix, each of the check nodes exchanging messages with at least two of the bit nodes; a reliability-generating circuit to generate a reliability index for each of the bit nodes; a bit-exchange circuit, coupled to said reliability-generating circuit, to generate at least two extrinsic bit indices for each of the check nodes based on the channel quality ratio and the extrinsic check indices; a check-exchange circuit, coupled to said bit-exchange circuit, to update a plurality of the extrinsic check indices based on the extrinsic bit indices, and provide the extrinsic check indices to the bit nodes; and a reliability-updating circuit, coupled to said check-exchange circuit and said verifying circuit, to update the reliability index of each of the bit nodes based on the extrinsic check indices, and determine an updated value for each of the bit nodes.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
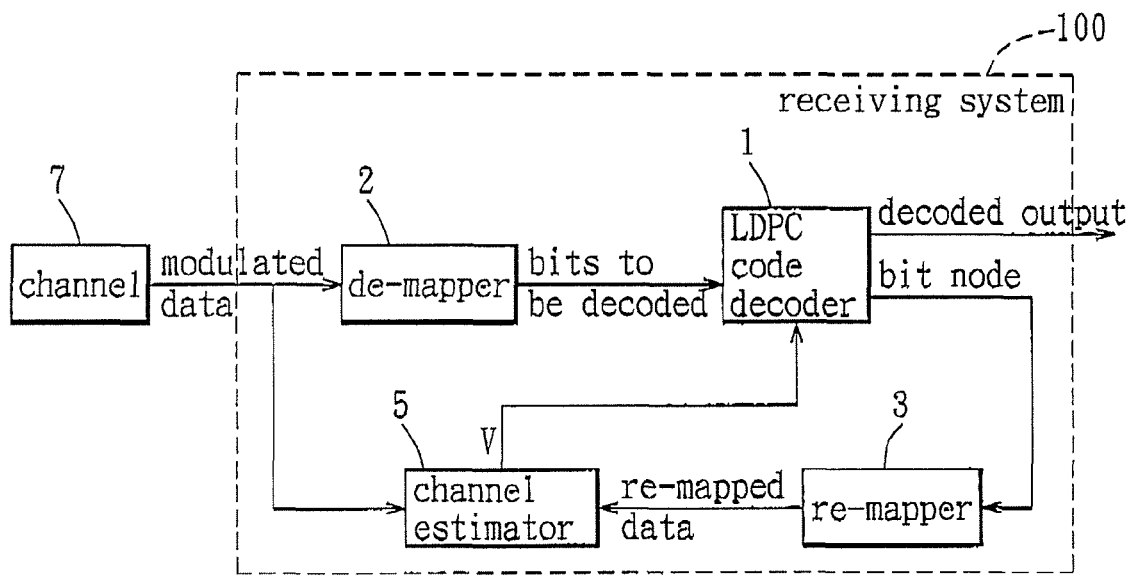
FIG. 1 is a schematic circuit block diagram of a preferred embodiment of a receiving system according to the present invention.

FIG. 1 illustrates the preferred embodiment of a receiving system 100 according to the present invention. The receiving system 100 is adapted to receive through a channel 7 a plurality of carrier signals, each of the carrier signals having at least (N) modulated data that are encoded through low-density parity-check (LDPC) code. The receiving system 100 includes a LDPC code decoder 1, and a de-mapper 2, a re-mapper 3 and a channel estimator 5, each of which is coupled to the LDPC code decoder 1. In this embodiment, the carrier signal is modulated through Binary Phase Shift Keying (BPSK). However, the carrier signal can be modulated through Quadrature Phase Shift Keying (QPSK), Orthogonal Frequency Division Multiplexing (OFDM), or other techniques.

The channel estimator 5 calculates an initial channel variable $\sigma_{START}$ indicative of channel quality based on the modulated data. The de-mapper 2 performs BPSK demodulation on the modulated data to obtain a plurality of bits that are to be decoded. For instance, when it is determined that the modulated data is '1', the bit that is to be decoded is determined to be '1', and when it is determined that the modulated data is '−1', the bit to be decoded is determined to be '0', wherein either hard or soft decision criteria can be used.

The LDPC code decoder 1 treats each of the bits that are to be decoded as a bit node $B_0, B_1, B_2 \ldots$ to be used for decoding. When decoding, the LDPC code decoder 1 updates probabilities of each of the bit nodes being either '0' or '1', and then determines updated values for each of the bit nodes $B_0$, $B_1$, $B_2 \ldots$. The re-mapper 3 then in accordance with the BPSK modulation technique maps the updated values of the bit nodes $B_0$, $B_1$, $B_2 \ldots$ to a plurality of re-mapped data. The channel estimator 5 then takes an average of errors between the re-mapped data and the modulated data as an updated channel variable $\sigma_{UPDATE}$, and outputs a channel quality ratio $$V\left(-\frac{\sigma_{UPDATE}^2}{\sigma_{START}^2}\right)$$

that is provided to the LDPC code decoder 1 as a basis for decoding.

Figure 2:
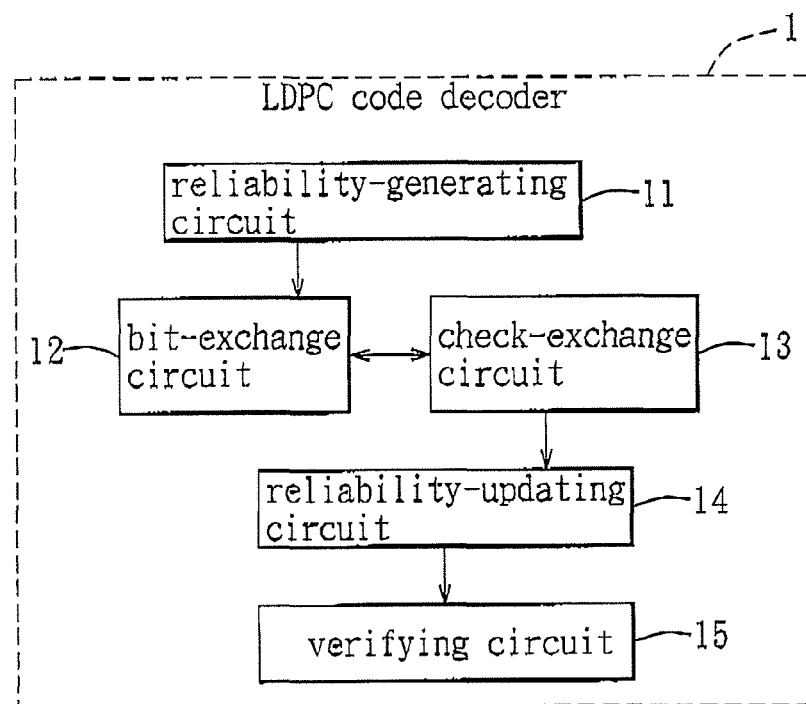
FIG. 2 is a schematic circuit block diagram of a parity-check-code decoder of the preferred embodiment.
Figure 3:
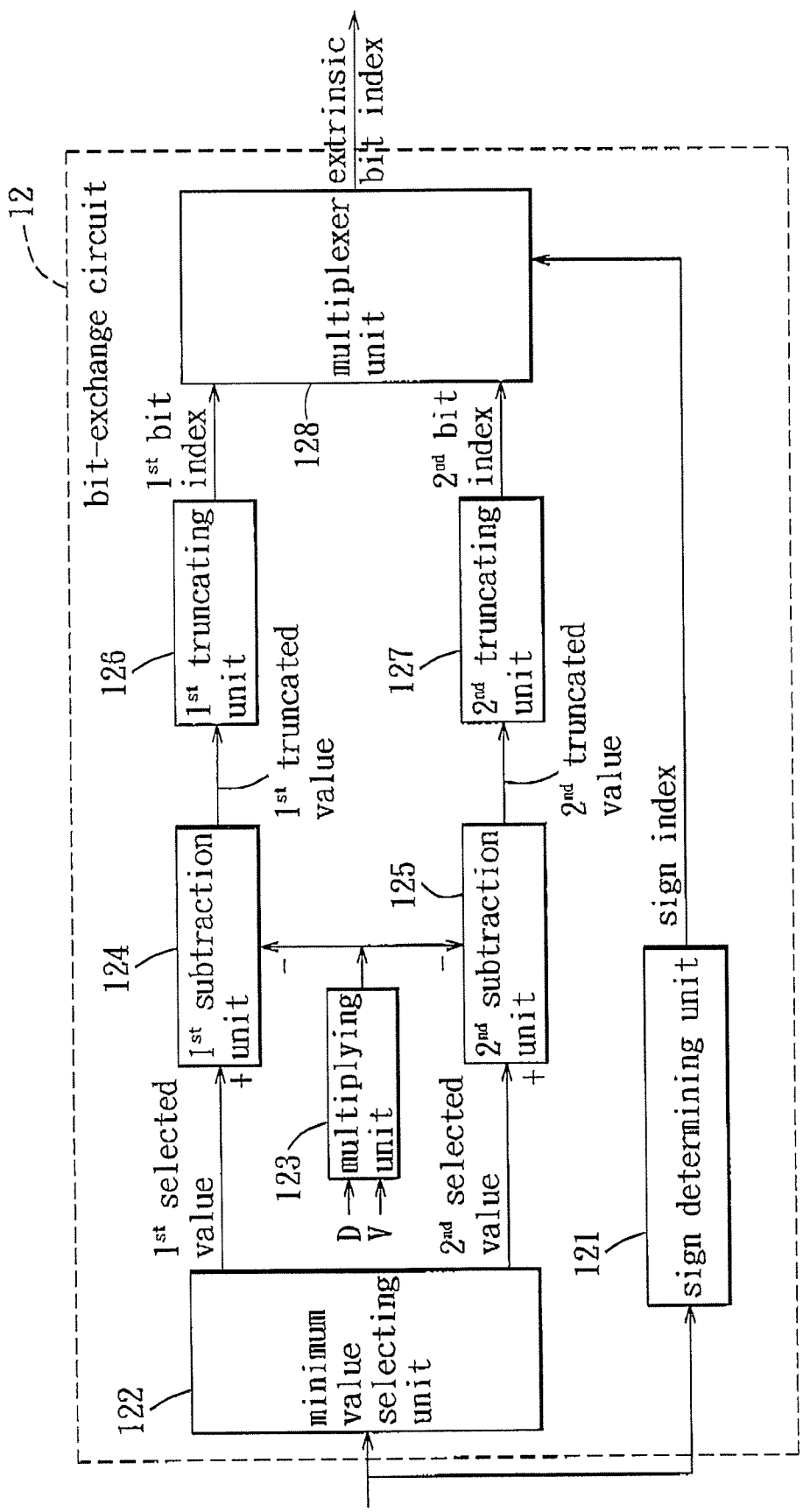
FIG. 3 is a schematic circuit block diagram of a bit-exchange circuit of the preferred embodiment.

Referring to FIGS. 2 and 3, the LDPC code decoder 1 includes a reliability-generating circuit 11, a bit-exchange circuit 12 coupled to the reliability-generating circuit 11, a check-exchange circuit 13 coupled to the bit-exchange circuit 12, a reliability-updating circuit 14 coupled to the check-exchange circuit 13, and a verifying circuit 15 coupled to the reliability-updating circuit 14. The bit-exchange circuit 12 includes a sign determining unit 121, a minimum value selecting unit 122, a multiplying unit 123, a first subtraction unit 124, a second subtraction unit 125, a first value-truncating unit 126, a second value-truncating unit 127, and a multiplexer unit 128.

The verifying circuit 15 of the LDPC code decoder 1 multiplies the updated values of the bit nodes $B_0, B_1, B_2 \ldots B_{N-1}$ by a LDPC code matrix (hereafter referred to as 'the matrix') having a size (N-K)×(N) so as to obtain (N-K) updated values of check nodes $C_0, C_1, C_2, \ldots, C_{K-1}$, wherein (N-K)>0. It is worth noting that if all the updated values of the check nodes $C_0, C_1, C_2, \ldots, C_{K-1}$ are zeros, it indicates that the updated values of the bit nodes $B_0, B_1, B_2, \ldots, B_{N-1}$ have not been affected by interference on the channel 7.

Figure 4:
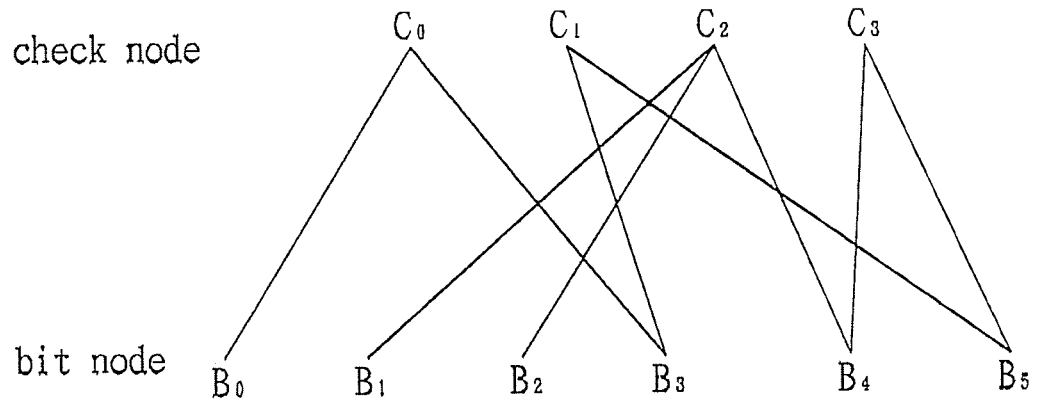
FIG. 4 is a schematic diagram to illustrate relationships between bit nodes and check nodes.

The matrix has (N-K)×(N) entries, the value of each entry being either '0' or '1', wherein (N-K)>0. Assuming that the element of the row m+1 and the column n+1 of the matrix is '1', then the check node $C_m$ can exchange messages with the bit node $B_n$, and the same check node $C_m$ can exchange messages with at least two of the bit nodes, wherein m=0, 1, 2, … (N-K−1), and n=0, 1, 2, … (N−1). For example, if the matrix, the bit nodes, and the check nodes are as illustrated in Formula (1), then relationships between the bit nodes and the check nodes are as shown in FIG. 4, wherein messages transmitted to the check node $C_2$ originate from the bit nodes $B_1$, $B_2$ and $B_4$, and the messages transmitted to the same bit node $B_4$ originate from the check nodes $C_2$ and $C_3$.

$$\begin{bmatrix} 1 & 0 & 0 & 1 & 0 & 0 \\ 0 & 0 & 0 & 1 & 0 & 1 \\ 0 & 1 & 1 & 0 & 1 & 0 \\ 0 & 0 & 0 & 0 & 1 & 1 \end{bmatrix} \cdot \begin{bmatrix} B_0 \\ B_1 \\ B_2 \\ B_3 \\ B_4 \\ B_5 \end{bmatrix} = \begin{bmatrix} C_0 \\ C_1 \\ C_2 \\ C_3 \end{bmatrix} \quad (1)$$

Figure 6:
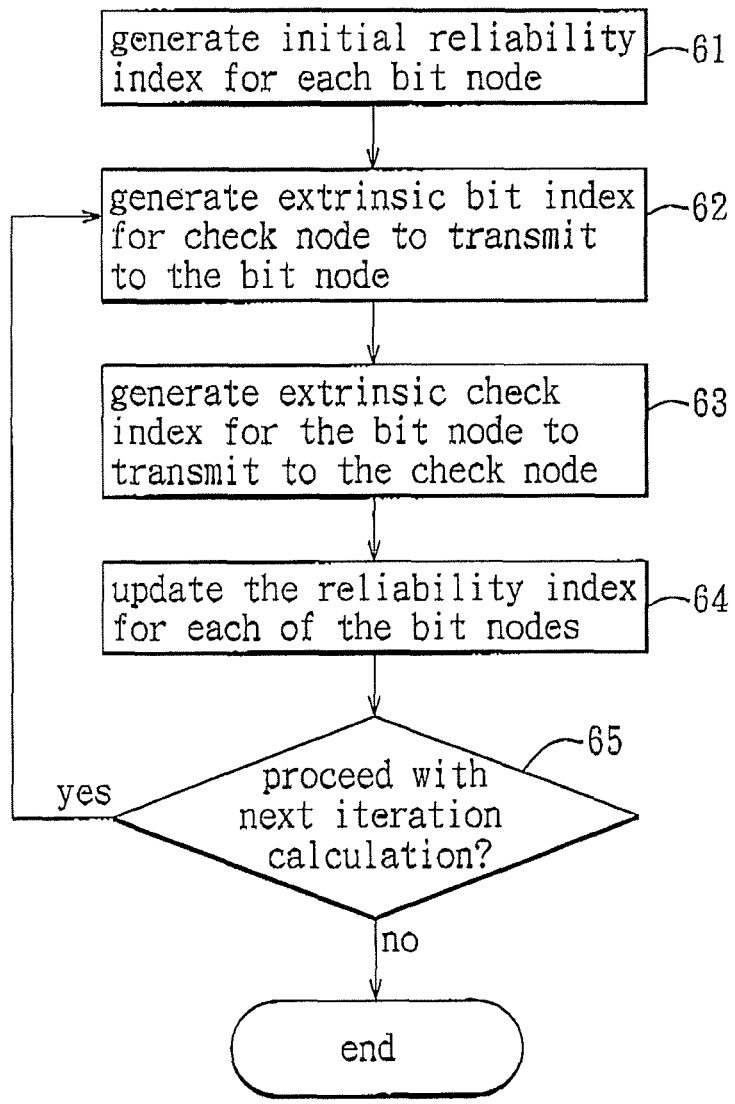
FIG. 6 is a flowchart to illustrate a decoding procedure of the parity-check-code decoder.

Referring to FIGS. 2 and 6, the LDPC code decoder 1 of this embodiment uses log-likelihood ratio (LLR) to simplify calculations, thereby exchanging multiplication for comparatively simple addition. For example, the LLR of Z=X×Y can be calculated as follows: LLR(Z)=LLR(X)+LLR(Y).

The LDPC code decoder 1 performs the following steps:

In step 61, the verifying circuit 15 presets an iteration count to zero, and the bit-exchange circuit 12 presets an extrinsic bit offset value (D). However, in an actual circuit, the extrinsic bit offset value (D) can be generated based on the initial channel variable $\sigma_{START}$.

Figure 5A:
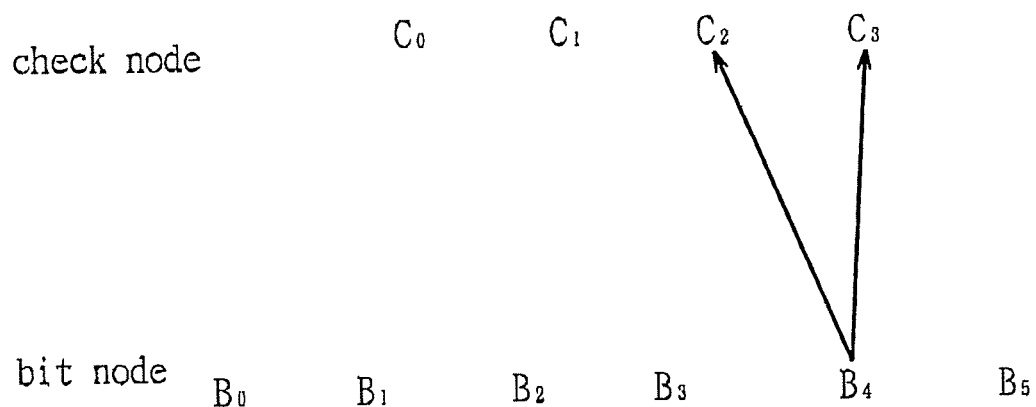
FIGS. 5(a)~5(c) are schematic diagrams to illustrate message exchange between the bit nodes and the check nodes.

The reliability-generating circuit 11 uses Formula (2) to generate an initial reliability index $Q_{START\_n}$ for the bit node $B_n$ based on the initial channel variable $\sigma_{START}$. The reliability index $Q_{START\_n}$ serves as an extrinsic check index $Q_{mn}$ that the bit node $B_n$ transmits to each of the check nodes $C_m$ capable of exchanging messages with the bit node $B_n$, as shown in FIG. 5(a). Accuracy of the channel variable thus affects reliability of the reliability index.

$$Q_{START\_n} = \ln\left[\frac{Pr(B_n = 0)}{Pr(B_n = 1)}\right] = \frac{-2\sqrt{E_B}\,|H|^2 \cdot B_n}{\sigma_{START}^2} = Q_{mn} \quad (2)$$

The reliability index is a ratio of the probabilities of the bit node $B_n$ being '0' and the bit node $B_n$ being '1', $E_B$ is a data energy encoded through LDPC coding at a transmitting end, and $|H|^2$ changes according to the modulation technique and channel condition. If multiple carrier modulation is used, channel strengths for different BPSK-modulated data can be different. In this embodiment, single carrier modulation is used, thus $|H|^2=1$. In addition, since the reliability index is the LLR of probabilities of the bit node $B_n$, when the probability of the bit node $B_n$ being '0' is high, the reliability index is greater than zero. Otherwise, the reliability index is not greater than zero. Moreover, as the probability of the bit node $B_n$ being a specific value ('0' or '1') increases, an absolute value of the reliability index becomes greater.

Figure 5B:
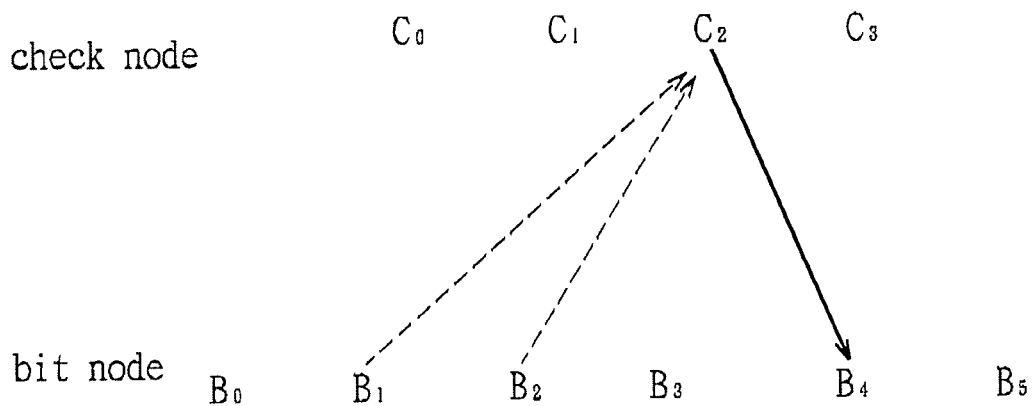

In step 62, the bit-exchange circuit 12 generates an extrinsic bit index $R_{mn}$ for one of the check nodes $C_m$ to transmit to a specific one of the bit nodes $B_n$ that is capable of exchanging messages with said one of the check nodes $C_m$. The extrinsic bit index $R_{mn}$ is defined as a message of probability (the probability of the bit nodes being '0' or being '1') of the bit nodes capable of exchanging messages with said one of the check nodes $C_m$ that is to be exchanged under the assumption that said one of the check nodes $C_m$ satisfies a condition of being equal to zero, wherein the message of probability to be exchanged that comprises the extrinsic bit index $R_{mn}$ includes only probabilities from the others of the bit nodes Bn' capable of exchanging messages with said one of the check nodes $C_m$, and not probability from the specific one of the bit nodes $B_n$. Taking FIG. 5(b) as an example, assuming that the check node $C_2$ is zero, the bit-exchange circuit 12 informs the bit node $B_4$ of the message of probability of the bit nodes $B_1$, $B_2$.

Since calculation for message exchange is somewhat complicated, the bit-exchange circuit 12 of this embodiment approximates the extrinsic bit index $R_{mn}$ using the channel quality ratio (V), as shown in Formula (3).

$$R_{mn} \approx \left[ \prod_{n' \in N(m)\backslash n} \text{sign}(Q_{mn'}) \right] \cdot \left\{ \min_{n' \in N(m)\backslash n} |Q_{mn'}| - D \cdot V \right\} \quad (3)$$

In the above formula, |x| is the absolute value of x, $N(m)\backslash n$ represents the others of the bit nodes $B_{n'}$ capable of exchanging messages with said one of the check nodes $C_m$ excluding the specific one of the bit nodes $B_n$, $$\min_x (G_x)$$

is the minimum of (G) in a set (x), and sgn(x) is the positive or negative sign of (x).

Figure 7:
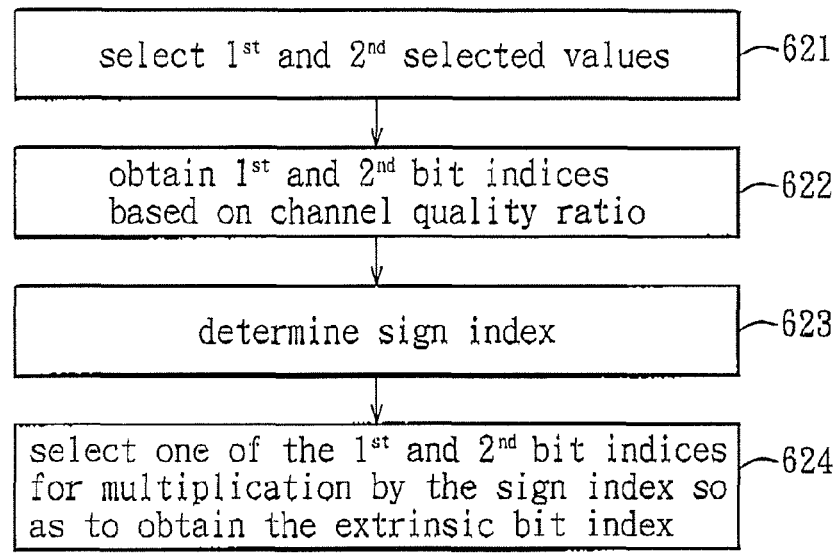
FIG. 7 is a flowchart to illustrate steps performed by the bit-exchange circuit.

Step 62 includes the following sub-steps for obtaining values for Formula (3), as shown in FIG. 7:

In sub-step 621, the minimum value selecting unit 122 selects a minimum value and a next lowest value from among absolute values of the extrinsic check indices $|Q_{mn}|\cdot|Q_{mn'}|$ of the bit nodes $B_n$, $B_{n'}$ capable of exchanging messages with said one of the check nodes $C_m$ to serve as a first selected value and a second selected value, respectively.

In sub-step 622, the multiplying unit 123 multiplies the channel quality ratio (V) by the extrinsic bit offset value (D) to obtain an updated offset value. The first subtraction unit 124 subsequently subtracts the updated offset value from the first selected value to obtain a first difference. The first truncating unit 126 then outputs a first bit index having a value not less than zero based on the sign of the first difference. In other words, when the first difference is not less than zero, the first difference serves as the first bit index. On the other hand, when the first difference is less than zero, zero serves as the first bit index. Similarly, the second subtraction unit 125 and the second truncating unit 127 cooperate to obtain a second bit index corresponding to the second selected value and having a value not less than zero.

In sub-step 623, the sign determining unit 121 multiplies together all the signs (positive or negative) of the extrinsic check indices $Q_{mn'}$ of the others of the bit nodes $B_{n'}$ belonging to $N(m)\backslash n$ and outputs a sign index, and the flow then proceeds to sub-step 624. The sequence according to which sub-step 623 is performed is not limited to what is disclosed herein, as long as it is performed before sub-step 624.

In sub-step 624, the multiplexer unit 128 selects one of the first and second bit indices for multiplying by the sign index so as to obtain the extrinsic bit index $R_{mn}$. The manner of selection is: for said. one of the check nodes $C_m$, when the first selected value is the absolute value of the extrinsic check index $|Q_{mn}|$ of the specific one of the bit nodes $B_n$, the multiplexer unit 128 selects the second bit index as the extrinsic bit index $R_{mn}$ for the specific one of the bit nodes $B_n$. For the others of the bit nodes $B_{n'}$, the multiplexer unit 128 selects the first bit index as the extrinsic bit index $R_{mn'}$.

Such manner of selection is due to the fact that the extrinsic bit index $R_{mn}$ transmitted to the specific one of the bit nodes $B_n$ does not include the absolute value of the extrinsic check index $|Q_{mn}|$ of the specific one of the bit nodes $B_n$. Therefore, when the absolute value of the extrinsic check index $|Q_{mn}|$ of the specific one of the bit nodes $B_n$ is selected as the minimum value, only the next lowest value can be selected as the extrinsic bit index $R_{mn}$ that is transmitted to the specific one of the bit nodes $B_n$.

The difference between step 62 and conventional offset belief propagation (BP) lies in that the bit-exchange circuit 12 further multiplies the channel quality ratio (V) by the extrinsic bit offset (D) such that the extrinsic bit index $R_{mn}$ obtained thereby is adjusted according to the updated channel variable $\sigma_{UPDATE}$. The extrinsic bit index $R_{mn}$ thus effectively reflects current estimated channel quality and thereby increases the reliability of the decoding. In addition, when the initial channel variable $\sigma_{START}$ is incorrectly estimated such that an inappropriate extrinsic bit offset value (D) is used, if the updated channel variable $\sigma_{UPDATE}$ is not used in a timely manner for adjustment during the decoding process, the decoding rate will eventually be reduced.

Moreover, since the bit-exchange circuit 12 of this invention multiplies the channel quality ratio $$V\left( = \frac{\sigma_{UPDATE^2}}{\sigma_{START^2}} \right)$$

by the extrinsic bit offset (D) so as to reflect effectively the current channel quality, calculation of $$\frac{1}{\sigma_{START^2}}$$

is necessary only for the first iteration, and multiplication by $\sigma_{UPDATE}^2$ is sufficient for subsequent iterations. In contrast, the conventional method is realized by multiplying Formula (2) by $$\frac{\sigma_{START^2}}{\sigma_{UPDATE^2}}.$$

Since for each iteration, $\sigma_{UPDATE}^2$ is different, division must be performed anew. Therefore, in comparison with the conventional method, the multiplication (multiplying by $\sigma_{UPDATE}^2$) used in this invention is clearly simpler.

Figure 5C:
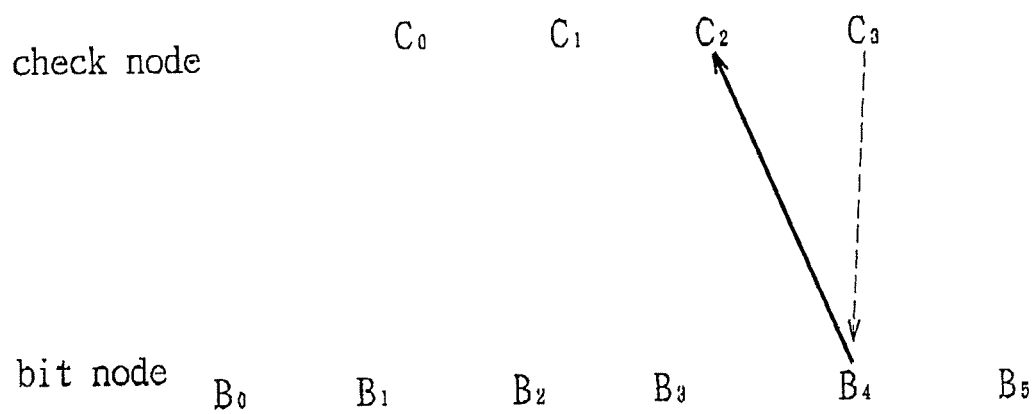

In step 63, the check-exchange circuit 13 updates the extrinsic check index $Q_{mn}$ that the bit node $B_n$ transmits to the check node $C_m$ capable of exchanging messages with the bit node $B_n$. The extrinsic check index $Q_{mn}$ is defined as the extrinsic bit indices $R_{mn}$, $R_{m'n}$ to be exchanged between the specific one of the check nodes $C_m$ and the another of the check nodes $C_{m'}$ under the assumption that the another of the check nodes $C_{m'}$ capable of exchanging messages with said one of the bit nodes $B_n$ excluding the specific one of the check nodes $C_m$ is zero, wherein the extrinsic check index $Q_{mn}$ to be transmitted to the specific one of the check nodes $C_m$ includes only the extrinsic bit index $R_{m'n}$ from the another of the check nodes $C_{m'}$ capable of exchanging messages with said one of the bit nodes $B_n$, and excludes the extrinsic bit index $R_{mn}$ originating from the specific one of the check nodes $C_m$. Taking FIG. 5(c) as an example, the check-exchange circuit 13 notifies the check node $C_2$ via the bit node $B_4$ of the extrinsic bit index of the check node $C_3$ that satisfies the condition of being equal to zero.

The extrinsic check index $Q_{mn}$ is calculated as shown in Formula (4), wherein $M(n)\backslash m$ represents the another of the check nodes $C_{m'}$ capable of exchanging messages with said one of the bit nodes $B_n$, excluding the specific one of the check nodes $C_m$.

$$Q_{mn} = Q_{START\_n} + \sum_{m' \in M(n) \setminus m} R_{m'n} \quad (4)$$

In step 64, the reliability-updating circuit 14 adds the extrinsic check index $Q_{mn}$ to the extrinsic bit index $R_{mn}$ of the check node $C_m$ when the check node $C_m$ satisfies the condition of being equal to zero, and obtains an updated reliability index $Q_n$ for the bit node $B_n$ in accordance with Formula (5), wherein M(n) represents all of the check nodes $C_m$ capable of exchanging messages with the bit node $B_n$. Taking FIG. 5(c) as an example, the reliability-updating circuit 14 sums the extrinsic bit indices of the check nodes $C_2$, $C_3$ that satisfy the condition of being equal to zero so as to obtain the updated reliability index of the bit node $B_4$.

$$Q_n = \ln\left[\frac{Pr(B_n = 0)}{Pr(B_n = 1)}\right] = Q_{START\_n} + \sum_{m \in M(n)} R_{mn} \quad (5)$$

Moreover, from observing Formula (3), it is understood that the extrinsic bit index $R_{mn}$ is adjustable according to the estimated channel quality ratio $V(=\sigma_{UPDATE}^2/\sigma_{START}^2)$, and synthesizes the messages from the others of the bit nodes $B_n$, capable of exchanging messages with said one of the check nodes $C_m$. Since the extrinsic bit index $R_{mn}$ is added into Formula (5), the updated reliability index $Q_n$ is more reliable than the initial reliability index $Q_{START\_n}$.

In step 65, the verifying circuit 15 determines whether to proceed with calculation for a next iteration based on the reliability index $Q_n$ of the bit node $B_n$.

Figure 8:
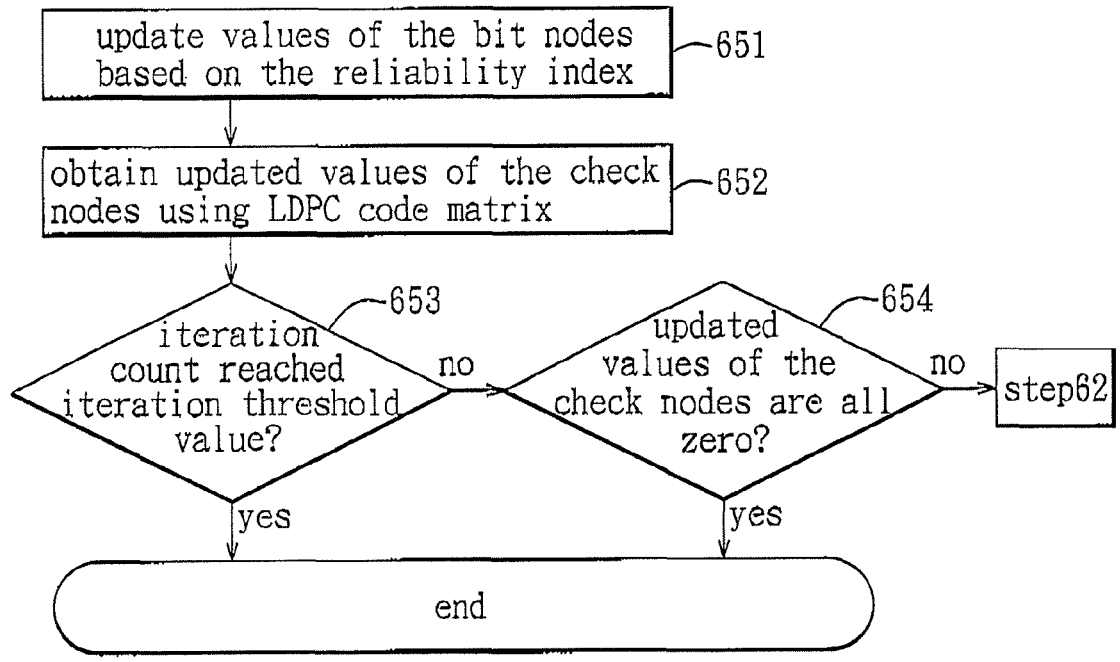
FIG. 8 is a flowchart to illustrate steps performed by a verifying circuit of the preferred embodiment.

Step 65 includes the following sub-steps, as shown in FIG. 8:

In sub-Step 651, the verifying circuit 15 updates the value of the bit node $B_n$ based on the reliability index $Q_n$, and transmits the updated value of the bit node $B_n$ to the re-mapper 3 for updating the channel quality ratio (V). When the reliability index $Q_n$ is greater than zero, the verifying circuit 15 updates the bit node $B_n$ to '0'. When the reliability index $Q_n$ is not greater than zero, the verifying circuit 15 updates the bit node $B_n$ to '1'. Moreover, as the iteration count increases, the reliability of the reliability index $Q_n$ increases, and accordingly, the absolute value of the reliability index $Q_n$ becomes greater. Since the reliability index is the logarithm of the ratio of the probabilities of the bit node $B_n$ being '0' and being '1', as the absolute value of the reliability index $Q_n$ becomes greater, the probability of the updated bit node $B_n$ being a specific value ('0' or '1') increases.

In sub-step 652, the verifying circuit 15 multiplies the (N) updated values of the bit nodes $B_0 \sim B_{N-1}$ by the matrix to obtain the (N-K) updated values of the check nodes $C_0 \sim C_{N-K-1}$.

In sub-step 653, the verifying circuit 15 checks whether the iteration count is greater than an iteration threshold value. If the iteration count is greater than the iteration threshold value, the decoding procedure ends. Otherwise, the flow proceeds to sub-step 654.

In sub-step 654, the verifying circuit 15 checks whether the updated values of the check nodes $C_0 \sim C_{N-K-1}$ are all zeros. If all the updated values of the check nodes $C_0 \sim C_{N-K-1}$ are zeros, the decoding procedure ends, and the (k) updated values of the bit nodes are taken as decoding output. Otherwise, the verifying circuit 15 increments the iteration count by one, and the flow returns to Step 62 to perform calculation for a next iteration.

The reason for performing Step 65 is as follows: the verifying circuit 15 uses the matrix to reconfirm whether the check nodes $C_0 \sim C_{N-K-1}$ are all equal to zero, and further infers whether the bit nodes $B_0 \sim B_{N-1}$ are similar to the output of a LDPC encoder at the transmitting end so as to ensure minimal interference on the channel 7. Furthermore, in step 62, taking the channel quality ratio (V) into account speeds convergence of the check nodes $C_0 \sim C_{N-K-1}$ toward zero, and at the same time reduces the iteration count.

It is worth noting that, the order in which Steps 63, 64 are performed can be reversed. That is, in step 64, assuming that all the check nodes $C_m$ capable of exchanging messages with the bit node $B_n$ satisfy the condition of being equal to zero, the reliability-updating circuit 14 can first generate the reliability index $Q_n$ for the bit node $B_n$. Then, in step 63, the check-exchange circuit 13 can subtract the extrinsic bit index $R_{mn}$ of the check node $C_m$ that satisfies the condition of being equal to zero from the reliability index $Q_n$ so as to obtain the extrinsic check index $Q_{mn}$ that the bit node $B_n$ transmits to the check node $C_m$.

It is worth noting that, in this embodiment, the reliability generating device 11 generates the initial reliability index $Q_{START\_n}$ according to the initial channel variable $\sigma_{START}$, and the channel estimator 5 generates the channel quality ratio (V) according to the channel variables $\sigma_{START}$ and $\sigma_{UPDATE}$. However, the circuit can be designed so that calculation is based on other parameters that reflect the channel quality, such as a signal-to-noise ratio (SNR).

Figure 9:
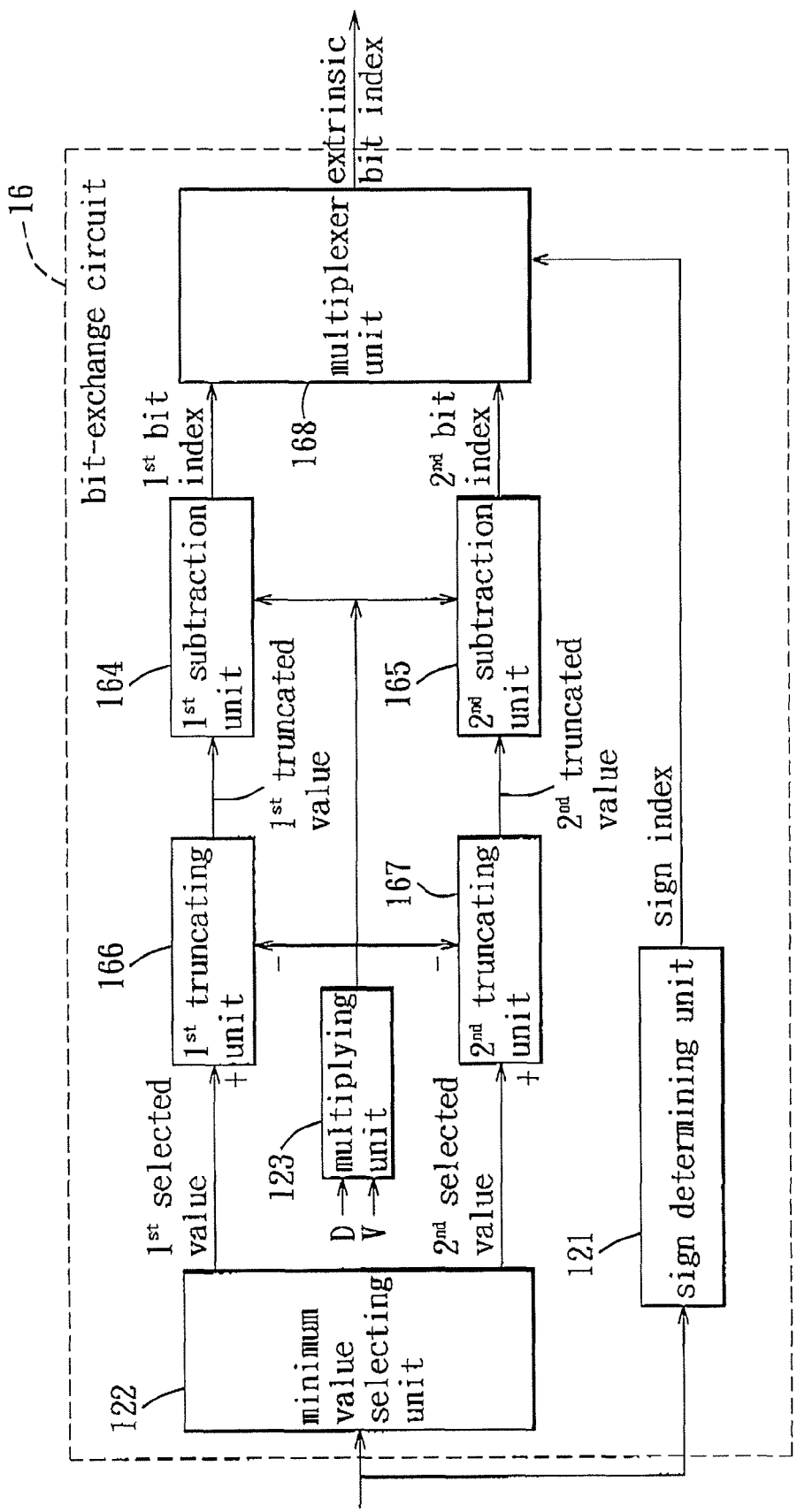
FIG. 9 is a schematic circuit block diagram of another implementation of the bit-exchange circuit.

Referring to FIG. 9, in another implementation of the bit-exchange circuit 16, the order in which the subtraction units 164, 165 and the truncating units 166, 167 are used can be reversed. Namely, after selection is performed by the minimum value selecting unit 12, the first truncating unit 166 can output a first truncated value that is not less than the updated offset value based on the first selected value and the updated offset value. In other words, when the first selected value is not less than the updated offset value, the first selected value serves as the first truncated value. On the other hand, when the first selected value is less than the updated offset value, the updated offset value serves as the first truncated value. Similarly, the second truncating unit 167 outputs a second truncated value corresponding to the second selected value. Subsequently, the first subtraction unit 164 subtracts the updated offset value from the first truncated value so as to obtain the first bit index, and the second subtraction unit 165 likewise subtracts the updated offset value from the second truncated value so as to obtain the second bit index. Lastly, the multiplexer unit 168 outputs the extrinsic bit index $R_{mn}$ based on the first and second bit indices.

Figure 10:
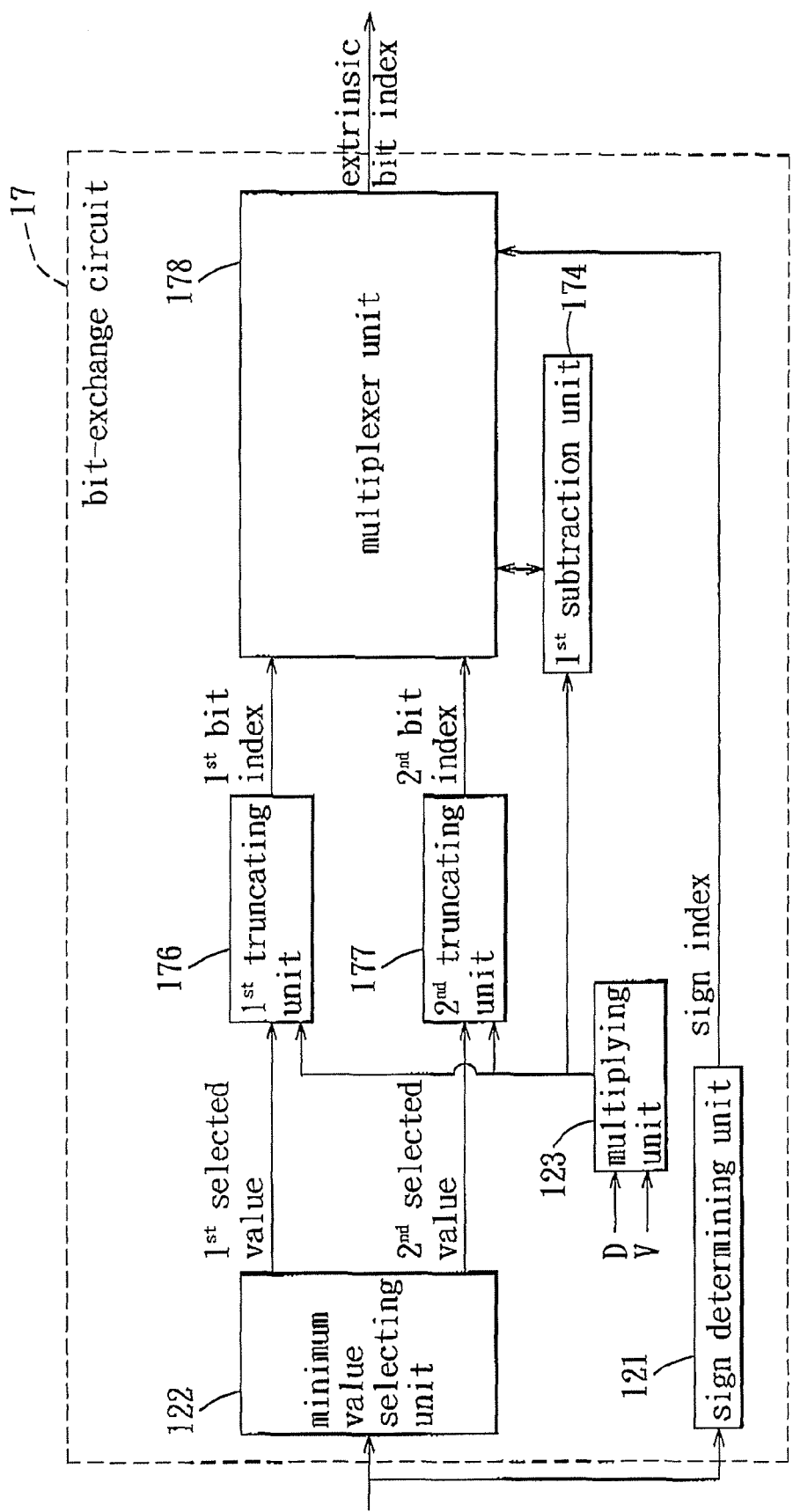
FIG. 10 is a schematic circuit block diagram of yet another implementation of the bit-exchange circuit.

FIG. 10 illustrates yet another implementation of the bit-exchange circuit 17 that differs from the previous implementation in that the multiplexer unit 178 receives directly outputs (the first and second bit indices) from the truncating units 176, 177, and selects one of the outputs to provide to the first subtraction unit 174, the first subtraction unit 174 subtracting the updated offset value from the selected one of the first and second bit indices so as to obtain a first difference. The multiplexer unit 178 then multiplies the first difference by the sign index so as to obtain the extrinsic bit index $R_{mn}$.

Moreover, it should be noted that the LDPC code decoder 1 of this embodiment can be implemented independently of the receiving system 100.

In sum, the parity-check-code decoder 1 and receiving system 100 of this invention use the channel estimator 5 to calculate the channel quality ratio (V) following each iteration. Since the bit-exchange circuit 12, 16, 17 then uses the channel quality ratio (V) to adjust the extrinsic bit index $R_{mn}$ through multiplication, the receiving system 100 effectively references the channel quality during the decoding process so as to increase decoding reliability, reduce the iteration count, and reduce complexity of calculation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A receiving system adapted to receive through a channel at least N modulated data that are encoded through parity-check (PC) coding, the receiving system comprising:
    a channel estimator to estimate a channel quality ratio of a channel receiving quality based on the modulated data; and
    a PC code decoder, coupled to said channel estimator, to obtain at least N bit nodes based on the modulated data, said PC code decoder including a verifying circuit, a reliability-generating circuit, a bit-exchange circuit, a check-exchange circuit, and a reliability-updating circuit,
    wherein, the verifying circuit is configured to multiply the at least N bit nodes by a PC code matrix so as to obtain N-K check nodes, each of the check nodes exchanging messages with at least two of the at least N bit nodes based on the PC code matrix,
    wherein, the reliability-generating circuit is configured to generate a reliability index for each of the bit nodes, the reliability index serving as an extrinsic check index,
    wherein, the bit-exchange circuit is configured to generate at least two extrinsic bit indices for each of the check nodes based on the channel quality ratio, an extrinsic bit offset value, and the extrinsic check indices.

2. The system of claim 1, where the check-exchange circuit is configured to update a plurality of the extrinsic check indices based on the extrinsic bit indices, and to provide the extrinsic check indices to the bit nodes.

3. The system of claim 2, where the reliability-updating circuit is configured to update the reliability index of each of the bit nodes based on the extrinsic check indices, and to determine an updated value for each of the bit nodes.

4. The system of claim 1, wherein said verifying circuit updates the bit nodes based on the reliability indices, multiplies the updated bit nodes by the PC code matrix so as to obtain (N-K) updated check nodes, and subsequently checks the updated check nodes so as to determine whether to proceed with calculation for a next iteration.

5. The system of claim 1, further comprising a de-mapper for performing demodulation processing on the modulated data, and subsequently sending a result of the demodulation processing to said PC code decoder.

6. The system of claim 1, further comprising a re-mapper for receiving the updated values of the bit nodes from said PC code decoder, mapping the updated values of the bit nodes to a plurality of re-mapped data accordingly, and providing the re-mapped data to said channel estimator for recalculating the channel quality ratio in conjunction with the modulated data.

7. A receiving system adapted to receive through a channel at least N modulated data that are encoded through parity-check (PC) coding, the receiving system comprising:
    a channel estimator to estimate a channel quality ratio of a channel receiving quality based on the modulated data; and
    a PC code decoder, coupled to said channel estimator, to obtain at least N bit nodes based on the modulated data, said PC code decoder including a verifying circuit, a reliability-generating circuit, a bit-exchange circuit, a check-exchange circuit, and a reliability-updating circuit,
    wherein said bit-exchange circuit includes a multiplying unit and a first subtraction unit.

8. A receiving system adapted to receive through a channel at least N modulated data that are encoded through parity-check (PC) coding, the receiving system comprising:
    a channel estimator to estimate a channel quality ratio of a channel receiving quality based on the modulated data: and
    a PC code decoder, coupled to said channel estimator, to obtain at least N bit nodes based on the modulated data, said PC code decoder including a verifying circuit, a reliability-generating circuit, a bit-exchange circuit, a check-exchange circuit, and a reliability-updating circuit,
    wherein said bit-exchange circuit includes a sign determining unit, a minimum value selecting unit, and a multiplexer unit.

9. The system of claim 8, wherein said bit-exchange circuit further includes a subtraction unit.

10. The system of claim 9, wherein said bit-exchange circuit further includes a first value-truncating unit and a second value-truncating unit.

11. A parity-check (PC) code decoder adapted for receiving a channel quality ratio of a channel receiving quality and at least N bits that are encoded in a PC code, each of the at least N bits being as a bit node, said decoder comprising:
    a verifying circuit to obtain N-K check nodes according to the N bit nodes and a PC code matrix, each of the check nodes exchanging messages with at least two of the bit nodes;
    a reliability-generating circuit to generate a reliability index for each of the bit nodes;
    a bit-exchange circuit, coupled to said reliability-generating circuit, to generate at least two extrinsic bit indices for each of the check nodes based on the channel quality ratio and the extrinsic check indices, wherein the bit-exchange comprises a multiplexer unit configured to output each of the at least two extrinsic bit indices based on a sign index generated according to the extrinsic check indices;
    a check-exchange circuit, coupled to said bit-exchange circuit, to update a plurality of the extrinsic check indices based on the extrinsic bit indices, and provide the extrinsic check indices to the bit nodes; and
    a reliability-updating circuit, coupled to said check-exchange circuit and said verifying circuit, to update the reliability index of each of the bit nodes based on the extrinsic check indices, and determine an updated value for each of the bit nodes.

12. The decoder of claim 11, wherein said bit-exchange circuit includes a multiplying unit and a first subtraction unit.

13. The encoder of claim 12, wherein said bit-exchange circuit includes a sign determining unit, and a minimum value selecting unit.

14. The encoder of claim 13, wherein said bit-exchange circuit further includes a second subtraction unit.

15. The encoder of claim 14, wherein said bit-exchange circuit further includes a first value-truncating unit and a second value-truncating unit.

16. The encoder of claim 15, wherein said first value-truncating unit making the first bit index not less than zero based on the sign of a difference obtained from said first subtraction unit, said second value-truncating unit making the second bit index not less than zero based on the sign of a difference obtained from said second subtraction unit.

17. The decoder of claim 11, wherein said verifying circuit updates the bit nodes based on the reliability indices, multiplies the updated bit nodes by the PC code matrix so as to obtain (N-K) updated check nodes, and subsequently checks the updated check nodes so as to determine whether to proceed with calculation for a next iteration.

* * * * *